(12) United States Patent
Zitzlsperger et al.

(10) Patent No.: US 9,853,198 B2
(45) Date of Patent: Dec. 26, 2017

(54) OPTOELECTRONIC COMPONENT AND METHOD OF PRODUCING SAME

(71) Applicant: OSRAM Opto Semiconductors GmbH, Regensburg (DE)

(72) Inventors: Michael Zitzlsperger, Regensburg (DE); Christian Ziereis, Lappersdorf (DE); Tobias Gebuhr, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/022,573

(22) PCT Filed: Sep. 18, 2014

(86) PCT No.: PCT/EP2014/069883
§ 371 (c)(1),
(2) Date: Mar. 17, 2016

(87) PCT Pub. No.: WO2015/040107
PCT Pub. Date: Mar. 26, 2015

(65) Prior Publication Data
US 2016/0240756 A1    Aug. 18, 2016

(30) Foreign Application Priority Data
Sep. 23, 2013  (DE) .................. 10 2013 219 063

(51) Int. Cl.
*H01L 23/00*  (2006.01)
*H01L 33/48*  (2010.01)
(Continued)

(52) U.S. Cl.
CPC .............. *H01L 33/62* (2013.01); *H01L 22/14* (2013.01); *H01L 33/483* (2013.01);
(Continued)

(58) Field of Classification Search
None
See application file for complete search history.

(56) References Cited

U.S. PATENT DOCUMENTS

| 7,705,366 B2 | 4/2010 | Seo et al. |
| 2005/0078936 A1 | 4/2005 | Charydczak et al. |

(Continued)

FOREIGN PATENT DOCUMENTS

| CN | 101490828 | 7/2009 |
| DE | 691 29 547 T2 | 1/1999 |

(Continued)

OTHER PUBLICATIONS

First Office Action dated Jun. 20, 2017, from corresponding Chinese Patent Application No. 201480052257.X.

*Primary Examiner* — Whitney T Moore
(74) *Attorney, Agent, or Firm* — DLA Piper LLP (US)

(57) ABSTRACT

An optoelectronic component includes a housing including a plastic material and a first lead frame section at least partly embedded in the plastic material, a first recess and a second recess, wherein a first upper section of an upper side of the first lead frame section is not covered by the plastic material in the first recess, a second upper section of the upper side of the first lead frame section is not covered by the plastic material in the second recess, the first recess and the second recess are separated from one another by a section of the plastic material, an optoelectronic semiconductor chip is arranged in the first recess, and no optoelectronic semiconductor chips is arranged in the second recess.

13 Claims, 8 Drawing Sheets

(51) Int. Cl.
- *H01L 33/54* (2010.01)
- *H01L 33/62* (2010.01)
- *H01L 21/66* (2006.01)
- *H01L 33/58* (2010.01)

(52) U.S. Cl.
CPC ............ *H01L 33/486* (2013.01); *H01L 33/54* (2013.01); *H01L 33/58* (2013.01); *H01L 2224/48091* (2013.01); H01L 2224/48247 (2013.01); H01L 2224/48465 (2013.01); H01L 2224/48479 (2013.01); H01L 2924/00014 (2013.01); H01L 2924/19107 (2013.01); H01L 2933/005 (2013.01); H01L 2933/0033 (2013.01); H01L 2933/0066 (2013.01)

(56) References Cited

U.S. PATENT DOCUMENTS

| | | |
|---|---|---|
| 2007/0001187 A1 | 1/2007 | Kim |
| 2009/0224271 A1 | 9/2009 | Seo et al. |
| 2010/0200879 A1 | 8/2010 | Lee et al. |
| 2011/0303941 A1 | 12/2011 | Lee |
| 2011/0309404 A1* | 12/2011 | Lee ................ H01L 33/486 257/99 |
| 2012/0205696 A1 | 8/2012 | Yoo et al. |
| 2013/0215434 A1 | 8/2013 | Joo et al. |
| 2014/0138715 A1* | 5/2014 | Zhang ............. H01L 25/0753 257/88 |

FOREIGN PATENT DOCUMENTS

| | | |
|---|---|---|
| DE | 10 2005 020 908 A1 | 8/2006 |
| EP | 2 418 700 A2 | 2/2012 |
| JP | 2006-303458 A | 11/2006 |

* cited by examiner

OPTOELECTRONIC COMPONENT AND METHOD OF PRODUCING SAME

TECHNICAL FIELD

This disclosure relates to an optoelectronic component and a method of producing an optoelectronic component.

BACKGROUND

Optoelectronic components, for example, light-emitting diode components having housings produced by injection molding or transfer molding are known. Those housings have electrically conductive lead frames at least partially embedded in a plastic material during the injection molding or transfer molding. Sections of the lead frame remaining uncovered on the upper side are used for electrical connection of optoelectronic semiconductor chips and bond wires. Sections of the lead frame remaining uncovered on the lower side are used as electrical contact pads for electrical contacting of the optoelectronic component. Such optoelectronic components may, for example, be configured as an SMT component for surface mounting.

During embedding of the lead frame in the plastic material, the sections of the lead frame intended to remain uncovered by the plastic material are sealed by parts of the molding tool, by a part of the molding tool on one side of the lead frame pressing the lead frame against another part of the molding tool on the opposite side of the lead frame. The remaining regions of the lead frame may be intentionally or unintentionally covered by the plastic material during the injection molding or transfer molding. It is therefore difficult to provide regions remaining uncovered on the lower side of the lead frame at positions not directly arranged next to those regions on the upper side of the lead frame intended to receive optoelectronic semiconductor chips and bond wires.

SUMMARY

We provide an optoelectronic component including a housing including a plastic material and a first lead frame section at least partially embedded in the plastic material, a first recess and a second recess, wherein a first upper section of an upper side of the first lead frame section is not covered by the plastic material in the first recess, a second upper section of the upper side of the first lead frame section is not covered by the plastic material in the second recess, the first recess and the second recess are separated from one another by a section of the plastic material, an optoelectronic semiconductor chip is arranged in the first recess, and no optoelectronic semiconductor chip is arranged in the second recess.

We also provide an optoelectronic component including a housing including a plastic material and a first led frame section at least partially embedded in the plastic material, and a first recess and a second recess, wherein a first upper section of an upper side of the first lead frame section is not covered by the plastic material in the first recess, a second upper section of the upper side of the first lead frame section is not covered by the plastic material in the second recess, the first recess and the second recess are separated from one another by a section of the plastic material, an optoelectronic semiconductor chip is arranged in the first recess, no optoelectronic semiconductor chip is arranged in the second recess, and the second upper section of the first lead frame section has a marking.

We further provide a method of producing an optoelectronic component comprising arranging a lead frame in a molding tool, a first part of the molding tool bearing on a first upper section of an upper side of the lead frame, a second part, separated from the first part, of the molding tool bearing on a second upper section of the upper side of the lead frame, embedding the lead frame in a plastic material, and arranging an optoelectronic semiconductor chip only on the first upper section of the upper side of the lead frame, but not on the second upper section.

Figure 1:
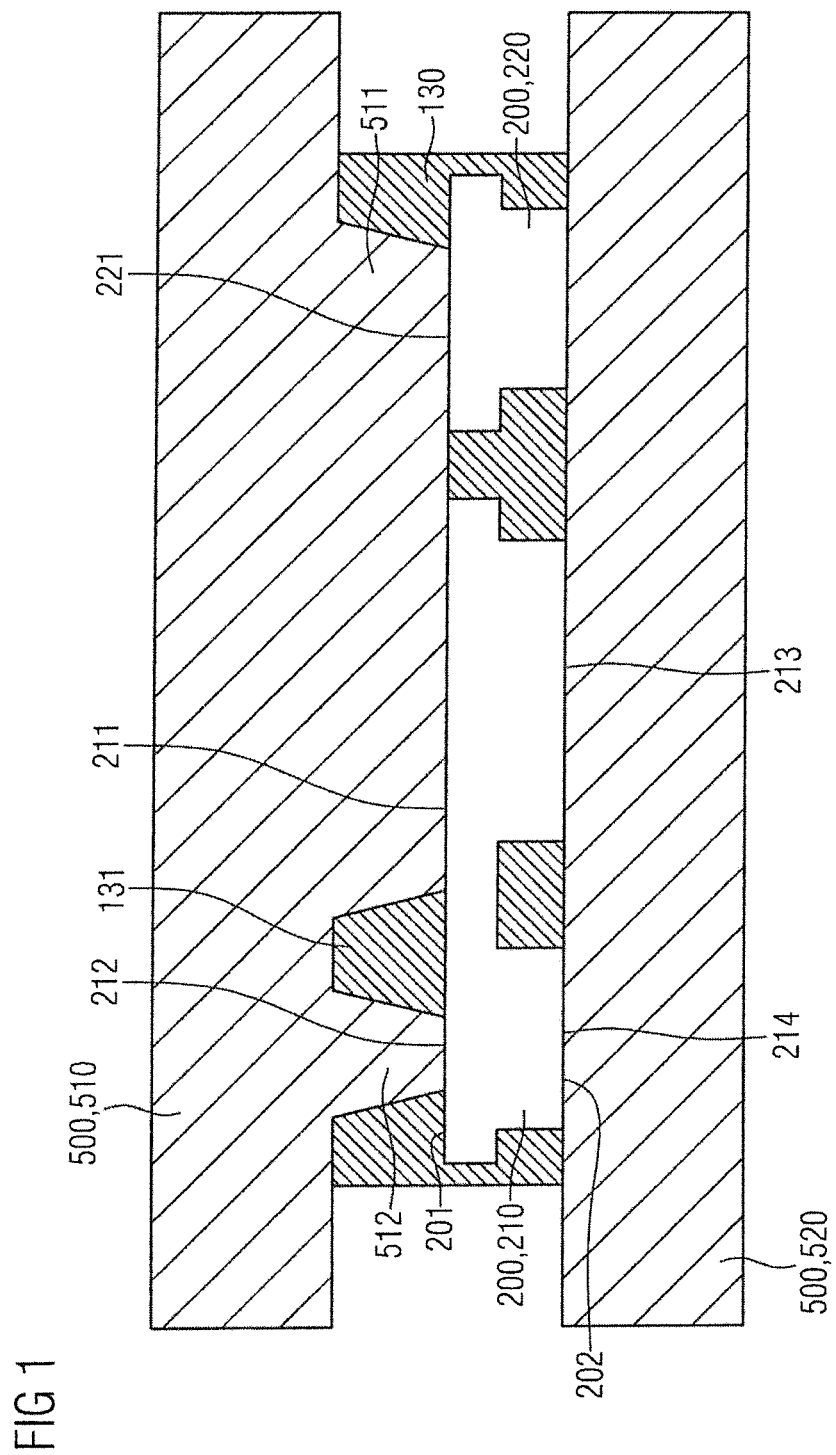
FIG. 1 shows a sectional view of a lead frame arranged in a molding tool during embedding in a plastic material.

LIST OF REFERENCES 10 first optoelectronic component
20 second optoelectronic component
30 third optoelectronic component
100 housing
110 first recess
120 second recess
130 plastic material
131 section
140 sawing path
200 lead frame
201 upper side
202 lower side
210 first lead frame section
211 first upper section
212 second upper section
213 first lower section
214 second lower section
215 marking
220 second lead frame section
221 third upper section
300 optoelectronic semiconductor chip
301 upper side
302 lower side
310 bond wire
400 optical lens
410 anchoring structure
500 molding tool
510 first tool part
511 first die
512 second die
520 second tool part
1100 housing
1120 second recess
2100 housing
2110 first recess
2120 second recess
2121 third recess 2122 fourth recess
2130 plastic material
2131 section
2200 lead frame
2201 upper side
2202 lower side
2210 first lead frame section
2211 first upper section
2212 second upper section
2213 first lower section
2214 second lower section
2215 seventh upper section
2220 second lead frame section
2221 third upper section
2222 fourth upper section
2230 third lead frame section
2231 fifth upper section
2232 sixth upper section
2300 first optoelectronic semiconductor chip
2301 second optoelectronic semiconductor chip
2310 first bond wire
2311 second bond wire
2320 first protective chip
2321 second protective chip
2330 third bond wire
2331 fourth bond wire
2340 first converter element
2341 second converter element
2400 encapsulation material

DETAILED DESCRIPTION

Our optoelectronic component comprises a housing comprising a plastic material and a first lead frame section at least partially embedded in the plastic material. The housing comprises a first recess and a second recess. A first upper section of an upper side of the first lead frame section is not covered by the plastic material in the first recess. A second upper section of the upper side of the first lead frame section is not covered by the plastic material in the second recess. The first recess and the second recess are separated from one another by a section of the plastic material. An optoelectronic semiconductor chip is arranged in the first recess. No optoelectronic semiconductor chip is arranged in the second recess.

Besides the first recess intended to receive the optoelectronic semiconductor chip, in which the first upper section of the first lead frame section is accessible, the optoelectronic component therefore comprises the second recess in which the second upper section of the first lead frame section is accessible, but which is not intended to receive an optoelectronic semiconductor chip. The second recess advantageously allows electrical contacting of the first lead frame section which may, for example, be used to check a functional capacity of the optoelectronic semiconductor chip of the optoelectronic component. Furthermore, provision of the second recess advantageously facilitates production of the housing of the optoelectronic component.

A first lower section of a lower side of the first lead frame section need not be covered by the plastic material. In this case, the first lower section overlaps with the first upper section in a projection perpendicular to the first lead frame section. Advantageously, the housing of this optoelectronic component can be produced straightforwardly by the first lead frame section being held between two tool parts of a molding tool during embedding of the first lead frame section in the plastic material in the region of the first upper section and in the region of the first lower section. In this way, the first upper section and the first lower section of the first lead frame section are sealed so that it is possible to ensure in a straightforward way that the first upper section of the first lead frame section and the first lower section of the first lead frame section remain uncovered by the plastic material.

A second lower section of a lower side of the first lead frame section need not be covered by the plastic material. In this case, the second lower section overlaps with the second upper section in a projection perpendicular to the first lead frame section. Advantageously, the housing of this optoelectronic component can be produced straightforwardly by the first lead frame section being held between two parts of a molding tool during embedding of the first lead frame section in the plastic material in the region of the second upper section and in the region of the second lower section of the first lead frame section. In this way, the second upper section of the first lead frame section and the second lower section of the first lead frame section are sealed during embedding of the first lead frame section in the plastic material which ensures that the second upper section and the second lower section of the first lead frame section remain uncovered by the plastic material. The second lower section of the lead frame section need not in this case overlap with the first upper section in a projection perpendicular to the first lead frame section. This allows improved use of space for the housing of this optoelectronic component.

The optoelectronic component may comprise a second lead frame section at least partially embedded in the plastic material. In this case, a third upper section of an upper side of the second lead frame section is not covered by the plastic material in the first recess. Advantageously, the third upper section of the second lead frame section of the housing of the optoelectronic component allows electrical contacting of the optoelectronic semiconductor chip of the optoelectronic component.

The third upper section may electrically conductively connect to the optoelectronic semiconductor chip by a bond wire. Advantageously, the optoelectronic semiconductor chip of the optoelectronic component can therefore be driven electrically via the first lead frame section and the second lead frame section.

The second upper section of the first lead frame section may have a marking. This marking may, for example, be used as a reference point for arrangement and alignment of components of the optoelectronic component. For example, the marking in the second upper section of the first lead frame section may be used to position and adjust the optoelectronic semiconductor chip. The marking may also be used to position and adjust a secondary optical element, for example, an optical lens of the optoelectronic component. The marking may also be used as a reference point to position the optoelectronic component on a circuit carrier.

The optoelectronic component may have an optical lens or a cover. In this case, the optical lens or the cover is anchored on the second recess. Advantageously, the second recess of the housing of the optoelectronic component therefore allows mechanically particularly robust connection of the optical lens or the cover to the housing of the optoelectronic component.

Our method of producing an optoelectronic component comprises arranging a lead frame in a molding tool, a first part of the molding tool bearing on a first upper section of an upper side of the lead frame, and a second part, separated from the first part, of the molding tool bearing on a second upper section of the upper side of the lead frame, embedding the lead frame in a plastic material and arranging an optoelectronic semiconductor chip only on the first upper section of the upper side of the lead frame, but not on the second upper section.

By the method, besides the first upper section of the upper side of the lead frame intended to receive the optoelectronic semiconductor chip, in the optoelectronic component which can be obtained by the method, the second upper section of the upper side of the lead frame is therefore also kept uncovered by the plastic material, even though the second upper section is not intended to receive an optoelectronic semiconductor chip. This advantageously also makes it possible to prevent covering with plastic material in a second lower section, overlapping with the second upper section in a projection perpendicular to the lead frame on a lower side of the lead frame. The second lower section may, for example, be used as a solder contact pad in the optoelectronic component that can be obtained by the method. The second upper section, remaining uncovered in the method, of the lead frame may furthermore advantageously be used to electrically contact the lead frame, for example, checking a functional capacity of the optoelectronic component that can be obtained by the method.

The method may comprise a further step of applying a marking in the second upper section of the lead frame. Advantageously, this marking may be used during further method steps as a reference position for alignment of further components on the optoelectronic component, as well as for alignment of the optoelectronic component on a carrier.

The marking may be applied by etching, embossing, stamping or a laser. Advantageously, the method therefore makes it possible to apply an optically highly visible marking in the second upper section of the lead frame.

The method may comprise a further step of checking a functional capacity of the optoelectronic component, the lead frame being electrically contacted in the second upper section during the checking. Advantageously, the method therefore makes it possible to check the functional capacity of the optoelectronic component without the optoelectronic component already needing to be electrically contacted, for example, by a solder connection for this purpose. In this way, the method allows early rejection of defective optoelectronic components so that a cost saving can be obtained. Furthermore, by contacting the lead frame in the second upper section, the method allows individual checking of optoelectronic semiconductor chips in optoelectronic components having a plurality of optoelectronic semiconductor chips.

The method may comprise a further step of dividing the plastic material and the lead frame to obtain a multiplicity of optoelectronic components. Advantageously, the method therefore allows parallel production of a multiplicity of optoelectronic components in common working processes. In this way, the production costs per individual optoelectronic component can be greatly reduced.

The plastic material and the lead frame may be divided along a sawing path extending through the second upper section. Advantageously, the housing of the optoelectronic component that can be obtained by the method may therefore be configured with particularly compact dimensions.

The above-described properties, features and advantages as well as the way in which they are achieved will become more clearly and comprehensively understandable in connection with the following description of examples, which will be explained in more detail in connection with the drawings.

FIG. 1 shows a highly schematized sectional side view of a molding tool 500. The molding tool 500 may also be referred to as a mold tool. The molding tool 500 is used to carry out a shaping method (molding method), for example, an injection molding method or a transfer molding method.

The molding tool 500 comprises a first tool part 510 and a second tool part 520. An essentially closed cavity or a mold can be formed between the first tool part 510 and the second tool part 520. The first tool part 510 and the second tool part 520 can be moved relative to one another to open and close the mold. Lateral boundaries of the mold formed by the tool parts 510, 520 of the molding tool 500 are not represented in the schematic view in FIG. 1.

The first tool part 510 of the molding tool 500 has a first die 511 and a second die 512 separated from the first die 511. The dies 511, 512 are formed as projections and extend into the mold, formed by the tool parts 510, 520, of the molding tool 500.

In the representation of FIG. 1, a lead frame 200 is arranged in the mold of the molding tool 500. The lead frame 200 comprises an electric conductive material, preferably a metal, and is configured as an essentially flat sheet with an upper side 201 and a lower side 202 opposite the upper side 201. The lead frame 200 could also comprise a coated plastic or an anodized aluminum or be formed as a flexible circuit board or the like. In the lateral direction, the lead frame 200 is subdivided into a plurality of sections of which only a first lead frame section 210 and a second lead frame section 220 are represented in the representation of FIG. 1.

The lead frame sections 210, 220 of the lead frame 200 are held between the first tool part 510 and the second tool part 520 of the molding tool 500. The first die 511 and the second die 512 of the first tool part 510 press the lead frame sections 210, 220 of the lead frame 200 against the second tool part 520. In this case, the first die 511 bears on a first upper section 211 on the upper side 201 of the first lead frame section 210 and on a third upper section 221 on the upper side 201 of the second lead frame section 220. The second die 512 of the first tool part 510 of the molding tool 500 bears on a second upper section 212 on the upper side 201 of the first lead frame section 210.

The lower side 202 of the first lead frame section 210 of the lead frame 200 has a first lower section 213 and a second lower section 214. The first lower section 213 overlaps the first upper section 211 of the first lead frame section 210 in a projection perpendicular to the upper side 201 and the lower side 202 of the lead frame 200. The second lower section 214 overlaps the second upper section 212 in a projection perpendicular to the upper side 201 and the lower side 202 of the lead frame 200. For example, the first lower section 213 may be arranged directly below the first upper section 211 in a direction perpendicular to the lead frame 200. Correspondingly, the second lower section 214 may be arranged directly below the second upper section 212 of the first lead frame section 210 in a direction perpendicular to the lead frame 200.

Because the first die 511 and the second die 512 of the first tool part 510 of the molding tool 500 engage on the first upper section 211 and on the second upper section 212 of the first lead frame section 210 and exert a force there on the lead frame 200 in a direction perpendicular to the upper side 201 and the lower side 202 of the lead frame 200, the first lower section 213 and the second lower section 214 of the first lead frame section 210 are pressed firmly against the second tool part 520 of the molding tool 500.

In the molding tool 500, the lead frame sections 210, 220 of the lead frame 200 held by the tool parts 510, 520 are molded around with a plastic material 130 and are therefore at least partially embedded in the plastic material 130. The plastic material 130 may also be referred to as a mold material and may, for example, comprise an epoxy resin. The plastic material 130 is introduced into the mold formed between the first tool part 510 and the second tool part 520 of the molding tool 500 and essentially fills all regions of the mold which are not occupied by the lead frame 200.

Figure 2:
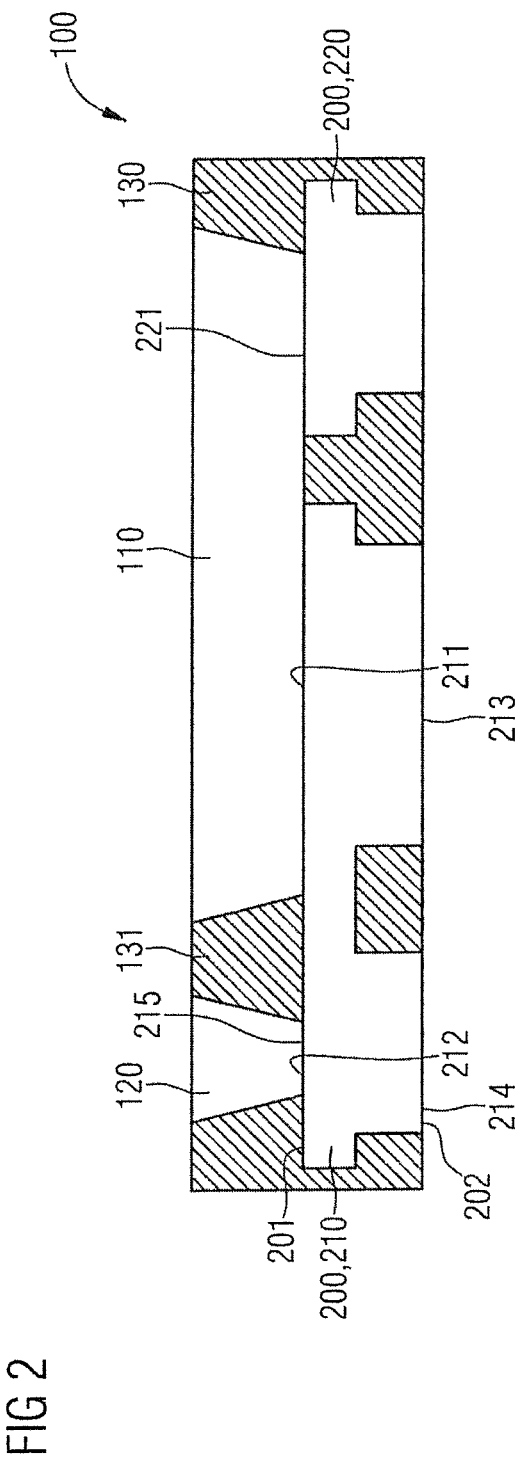
FIG. 2 shows a sectional side view of a housing formed by the embedding of the lead frame in the plastic material.

After curing the plastic material 130, the plastic material 130 with the embedded lead frame 200 forms a housing 100 that can be removed from the mold of the molding tool 500. FIG. 2 shows a schematic sectional side view of the housing 100 after removal from the molding tool 500.

The lead frame sections 210, 220 of the lead frame 200 are partially embedded in the plastic material 130. Only those parts of the upper side 201 and of the lower side 202 of the lead frame sections 210, 220 covered by the tool parts 510, 520 of the molding tool 500 have not been covered by the plastic material 130. In the spatial region occupied by the first die 511 of the first tool part 510, a first recess 110 has been formed in the plastic material 130 of the housing 100. In the first recess 110, the first upper section 211 of the first lead frame section 210 and the third upper section 221 of the second lead frame section 220 are exposed and not covered by the plastic material 130. In the spatial region occupied by the second die 512 of the first tool part 510 of the molding tool 500, a second recess 120 has been formed in the plastic material 130 of the housing 100. In the second recess 120, the second upper section 212 of the first lead frame section 210 is exposed and not covered by the plastic material 130.

Since the first lower section 213 and the second lower section 214 of the first lead frame section 210 of the lead frame 200 have been pressed by the dies 511, 512 of the first tool part 510 against the second tool part 520 of the molding tool 500, the first lower section 213 and the second lower section 214 of the first lead frame section 210 are also exposed and not covered by plastic material 130. Correspondingly, a part of the lower side 202 of the second lead frame section 220 is also exposed and not covered by the plastic material 130.

The recesses 110, 120 of the housing 100 respectively form regions closed in the lateral direction and bounded by the plastic material 130. The first recess 110 and the second recess 120 are separated from one another by a section 131 of the plastic material 130 and are therefore not continuous in the lateral direction.

Figure 3:
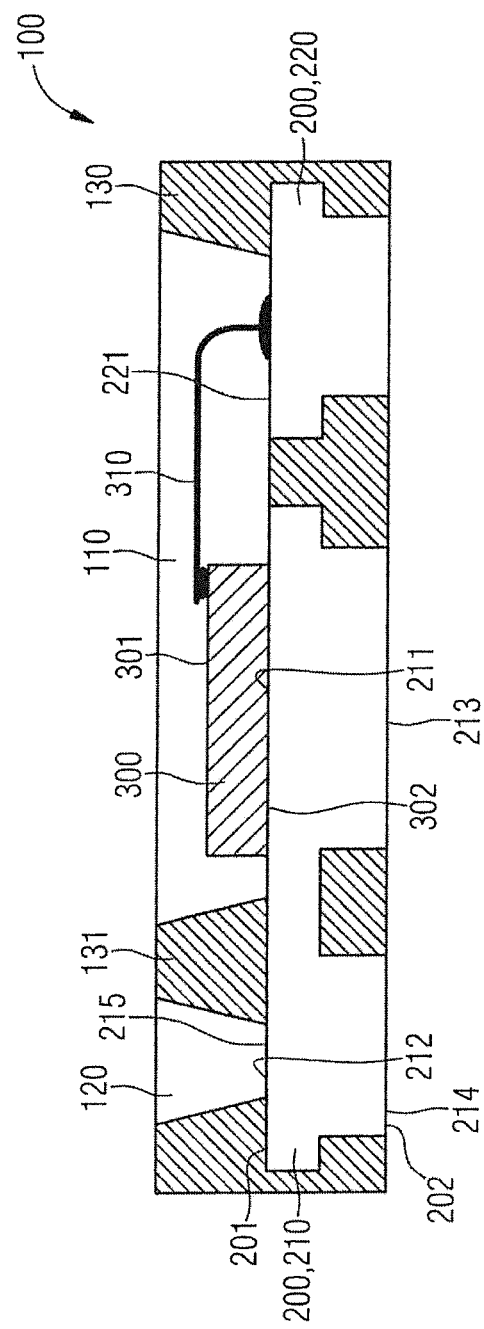
FIG. 3 shows a sectional side view of the housing with an optoelectronic semiconductor chip arranged in a recess.

FIG. 3 shows a schematic sectional side view of the housing 100 in a processing state chronologically following the representation of FIG. 2. An optoelectronic semiconductor chip 300 has been arranged in the first recess 110 of the housing 100. The optoelectronic semiconductor chip 300 may, for example, be a light-emitting diode chip (LED chip).

The optoelectronic semiconductor chip 300 has an upper side 301 and a lower side 302 opposite the upper side 301. The upper side 301 of the optoelectronic semiconductor chip 300 forms a radiation emission face of the optoelectronic semiconductor chip 300. The optoelectronic semiconductor chip 300 is configured to emit electromagnetic radiation, for example, visible light at its upper side 301.

The optoelectronic semiconductor chip 300 has two electrical contact pads of which one is arranged on the upper side 301 and one on the lower side 302 of the optoelectronic semiconductor chip 300 in the example shown in FIG. 3. The electrical contact pads are used to apply an electrical voltage to the optoelectronic semiconductor chip 300 to make the latter emit electromagnetic radiation.

The optoelectronic semiconductor chip 300 is arranged on a first upper section 211 of the first lead frame section 210. In this case, the lower side 302 of the optoelectronic semiconductor chip 300 faces the first upper section 211 of the first lead frame section 210 and thus connects to the first upper section 211 of the first lead frame section 210 such that there is an electrically conductive connection between the first lead frame section 210 and the electrical contact pad arranged on the lower side 302 of the optoelectronic semiconductor chip 300. For example, the optoelectronic semiconductor chip 300 may connect to the first lead frame section 210 by a solder connection in the first upper section 211. The electrical contact pad of the optoelectronic semiconductor chip 300, arranged on the upper side 301 of the optoelectronic semiconductor chip 300, electrically conductively connects to the third upper section 221 of the second lead frame section 220 by a bond wire 310. The optoelectronic semiconductor chip 300 and the bond wire 310 are preferably arranged entirely in the first recess 110 of the housing 100.

No optoelectronic semiconductor chip and no bond wire are arranged in the region of the second recess 120.

Figure 4:
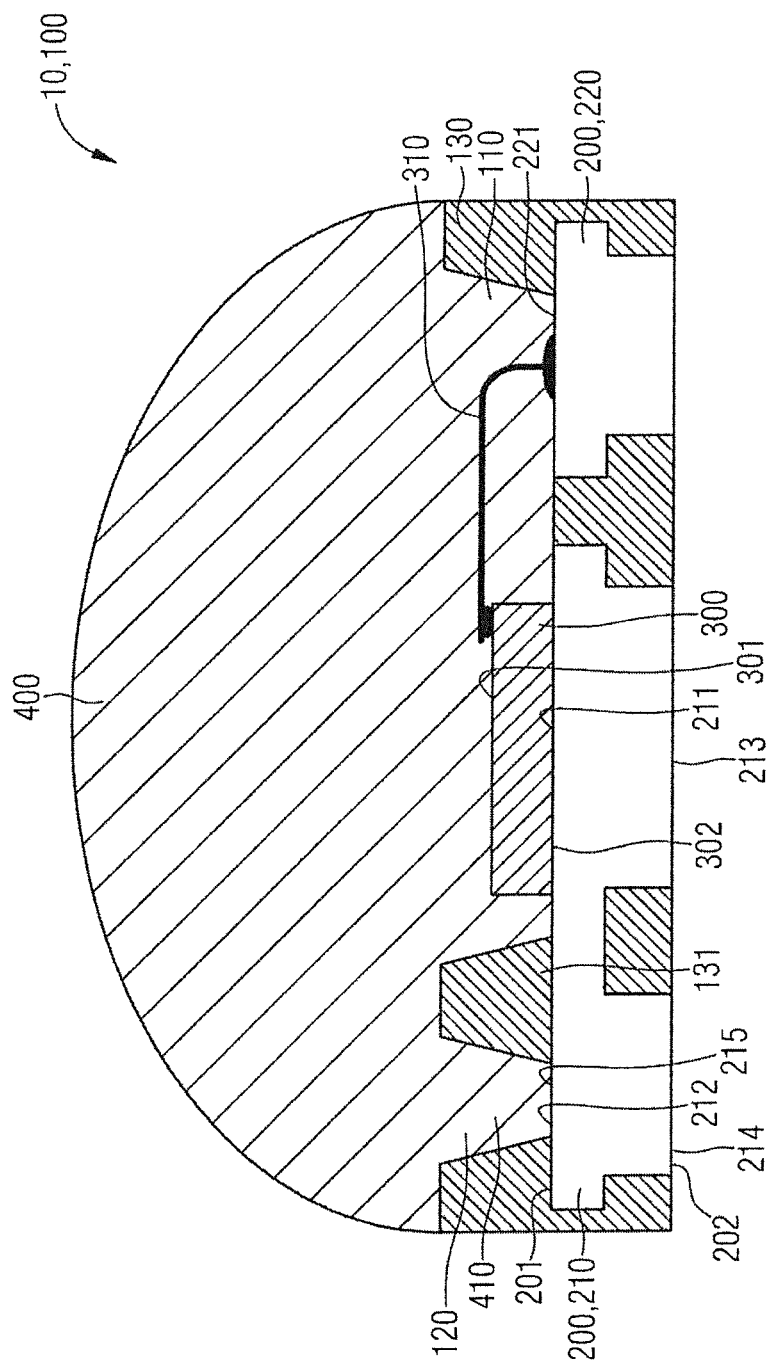
FIG. 4 shows a sectional side view of the housing with an optical lens arranged thereon.

FIG. 4 shows a schematic sectional side view of a first optoelectronic component 10 which has been produced by further processing from the housing 100 shown in FIG. 3. An optical lens 400 has been arranged on the housing 100. The optical lens 400 may, for example, comprise silicone. The optical lens 400 may, for example, have been produced by a molding method, for instance an injection molding method or a transfer molding method. The optical lens 400 is intended to deviate, for example, to focus electromagnetic radiation emitted by the optoelectronic semiconductor chip 300 of the first optoelectronic component 10.

The optical lens 400 is arranged on the upper side of the housing 100 of the first optoelectronic component 10 and, in the example represented, extends over the first recess 110 and the second recess 120. In this case, the material of the optical lens 400 also extends into the first recess 110 and the second recess 120. The part of the material of the optical lens 400 arranged in the second recess 120 of the housing 100 forms an anchoring structure 410 that mechanically robustly anchors the optical lens 400 to the housing 100 of the first optoelectronic component 10.

In the example shown in FIG. 4, the material of the optical lens 400 also fills the first recess 110 of the housing 100 so that the optoelectronic semiconductor chip 300 is embedded in the material of the optical lens 400. It is, however, also possible to introduce a further material in which the optoelectronic semiconductor chip 300 is embedded into the first recess 110 of the housing 100 before the optical lens 400 is arranged. Before this, a cover element, for instance a wavelength-converting element, may optionally also be arranged on the upper side 301 of the optoelectronic semiconductor chip 300. A further material may also be arranged in the second recess 120 before the optical lens 400 is formed. Provision of the optical lens 400 may also be entirely omitted. The first recess 110 and/or the second recess 120 of the housing 100 may optionally remain unfilled.

The lower side 202 of the second lead frame section 220 of the first optoelectronic component 10 and the first lower section 213 and/or the second lower section 214 of the first lead frame section 210 of the first optoelectronic component 10 may be used as electrical contact pads of the first optoelectronic component 10. The first optoelectronic component 10 may therefore, for example, be suitable as an SMT component for surface mounting. Electrical contacting of the electrical contact pads of the first optoelectronic component 10 may, for example, be carried out by reflow soldering. If the second lower section 214 of the first lead frame section 210 is used as an electrical contact pad, then this electrical contact pad of the first optoelectronic component 10 is not arranged below the first recess 110 of the housing 100 and not below the optoelectronic semiconductor chip 300 in a direction perpendicular to the lead frame 200. This makes it possible to control the shape of the housing 100 of the first optoelectronic component 10 for specific applications.

It is possible to simultaneously produce a multiplicity of housings 100 in a common working process. To this end, the lead frame 200 is configured with a multiplicity of continuous lead frame sections. There is a first lead frame section 210 and a second lead frame section 220 for each housing 100 to be formed. The common lead frame 200 is embedded in the plastic material 130 in the molding tool 500. In this case, the molding tool 500 has a first die 511 and a second die 512 for each housing 100 to be produced so that a first recess 110 and a second recess 120 are formed in the plastic material 130 for each housing 100 to be produced. After the optoelectronic semiconductor chips 300 have been arranged in all the first recesses 110, and optical lenses 400 have optionally been formed over each housing 100, the housings 100 of the first optoelectronic components 10 produced in this way are separated from one another by dividing the plastic material 130 and the lead frame 200 embedded in the plastic material 130.

The second upper section 212 of the first lead frame section 210 may have a marking 215. The marking 215 may, for example, be configured as an indentation or as a full opening through the lead frame 200. The marking 215 may, for example, be applied by an etching method, embossing or stamping or a laser. In particular, the marking 215 may already be applied before the lead frame sections 210, 220 are embedded in the plastic material 130. The marking 215 may, for example, be carried out together with the rest of the production and structuring of the lead frame 200.

The marking 215 may be used as a position reference during production of the first optoelectronic component 10 and/or during mounting of the first optoelectronic component 10. For example, the marking 215 may be used as a reference point for positioning the optoelectronic semiconductor chip 300 on the first upper section 211 of the first lead frame section 210 in the first recess 110 and/or as a reference point for the arrangement and alignment of the optical lens 400. The marking 215 may also be used as a reference point for arrangement and alignment of the first optoelectronic component 10 during mounting of the first optoelectronic component 10, for example, during arrangement of the first optoelectronic component 10 on a circuit carrier. In this case, it is preferred for the second recess 120 of the first optoelectronic component 10 to remain unfilled.

Figure 5:
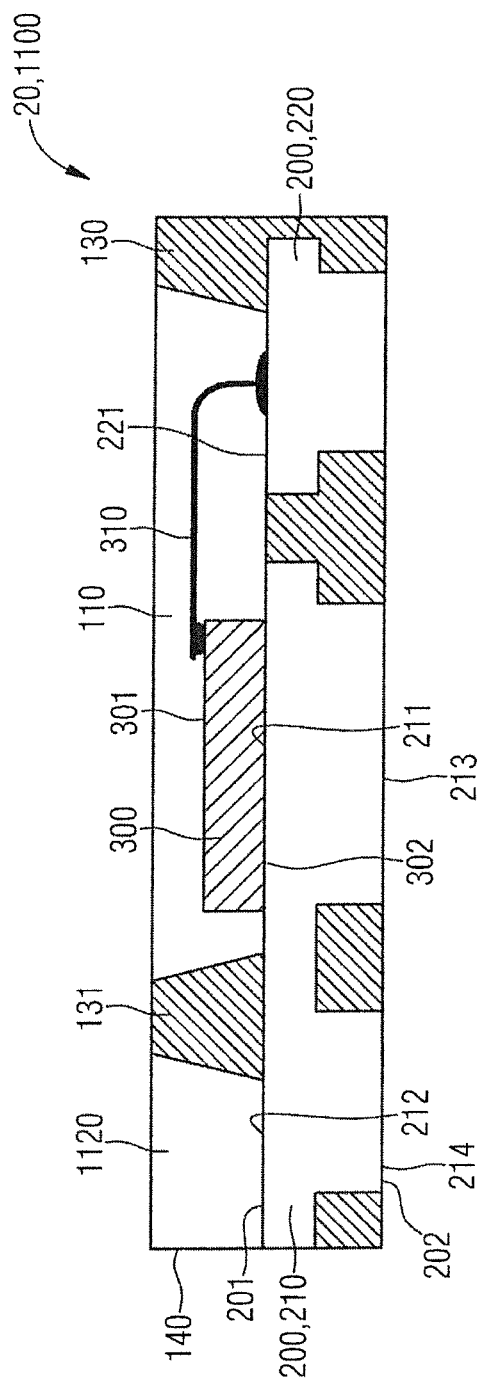
FIG. 5 shows a sectional side view of a further housing.

FIG. 5 shows a schematic sectional side view of a housing 1100 of a second optoelectronic component 20. The housing 1100 of the second optoelectronic component 20 corresponds substantially to the housing 100 of the first optoelectronic component 10, and may be produced by the method explained with the aid of FIGS. 1 to 4. In FIG. 5, parts of the housing 1100 corresponding to parts of the housing 100 are provided with the same references as in FIGS. 1 to 4 and will not be explained again in detail below.

In contrast to the housing 100 of the first optoelectronic component 10, the housing 1100 of the second optoelectronic component 20 has a second recess 1120 instead of the first recess 120. The second recess 1120 is not fully enclosed by the plastic material 130 in the lateral direction. The second recess 1120 is therefore laterally open.

During production of the housing 1100, the second recess 1120 was initially produced like the second recess 120 of the first optoelectronic component 10 by the second die 512 of the molding tool 500 as a laterally closed recess. During separation of the housing 1100 from other housings 1100 of the same type by dividing the plastic material 130 and the embedded lead frame 200, a sawing path 140 was applied such that it extended through the second recess 1120. In this way, a part of the plastic material 130 laterally enclosing the second recess 1120 was removed.

Figure 6:
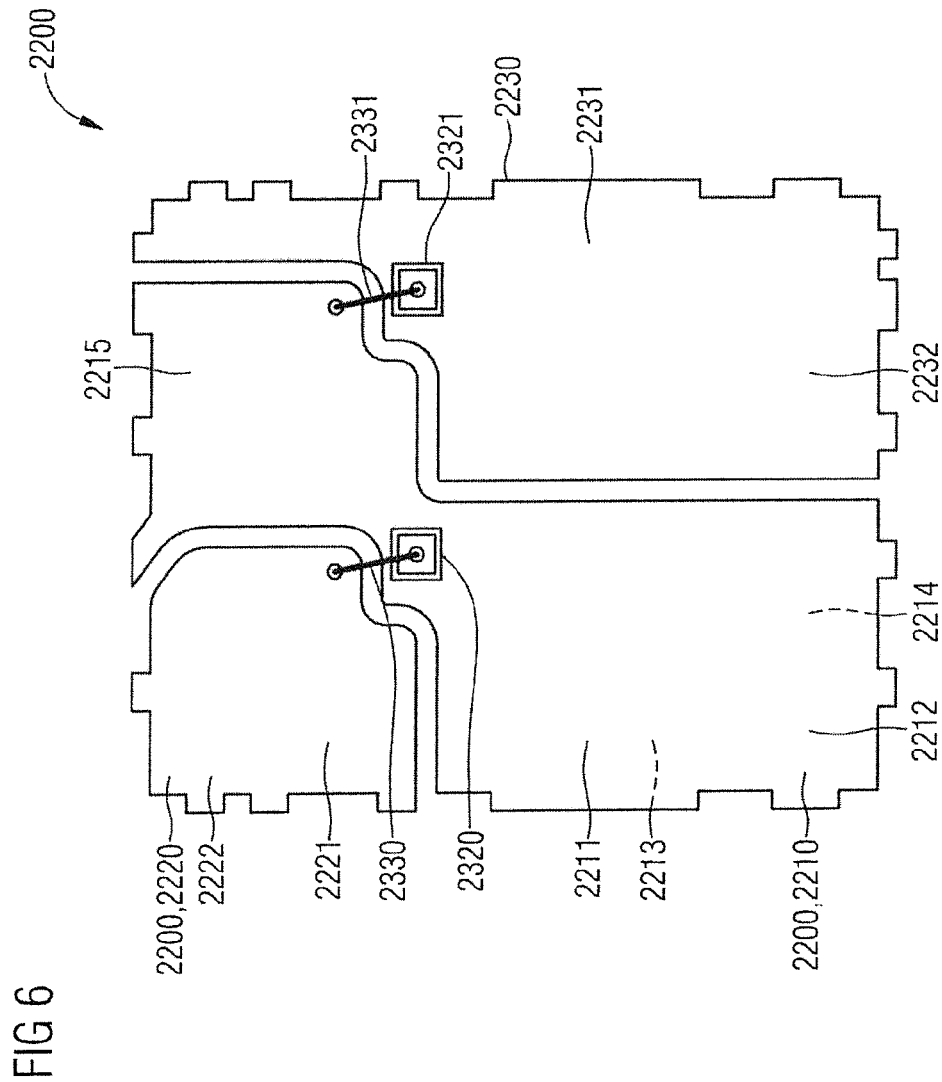
FIG. 6 shows a plan view of a part of a lead frame.

FIG. 6 shows, in a schematic representation, a plan view of a part intended for production of a housing 2100 of a lead frame 2200. The represented part of the lead frame 2200 comprises a first lead frame section 2210, a second lead frame section 2220 and a third lead frame section 2230. The lead frame sections 2210, 2220, 2230 do not electrically conductively connect to one another in the represented part of the lead frame 2200. The lead frame 2200 has an upper side 2201 and a lower side 2202 opposite the upper side 2201. The lead frame 2200 comprises an electrically conductive material, for example, a metal.

The upper side 2201 of the first lead frame section 2210 comprises a first upper section 2211, a second upper section 2212 and a seventh upper section 2215. The lower side 2202 of the first lead frame section 2210 comprises a first lower section 2213 and a second lower section 2214. The first lower section 2213 overlaps the first upper section 2211 in a projection perpendicular to the first lead frame section 2210. The second lower section 2212 overlaps the second upper section 2212 in a projection perpendicular to the first lead frame section 2210.

The upper side 2201 of the second lead frame section 2220 comprises a third upper section 2221 and a fourth upper section 2222. The upper side 2201 of the third lead frame section 2230 comprises a fifth upper section 2231 and a sixth upper section 2232.

A first protective chip 2320 is arranged on the upper side 2201 of the first lead frame section 2210 and electrically conductively connects to the first lead frame section 2210. A third bond wire 2230 furthermore connects the first protective chip 2320 electrically conductively to the upper side 2201 of the second lead frame section 2220. In this way, the first protective chip 2320 electrically connects between the first lead frame section 2210 and the second lead frame section 2220. The first protective chip 2320 may, for example, be configured as a protective diode and may be used as protection against damage by electrostatic discharges. A second protecttive chip 2321 corresponding to the first protective chip 2320 is arranged on the upper side 2201 of the third lead frame section 2230 and connects by a fourth bond wire 2331 to the upper side 2201 of the first lead frame section 2210 such that the second protective chip 2321 electrically connects between the third lead frame section 2230 and the first lead frame section 2210.

Figure 7:
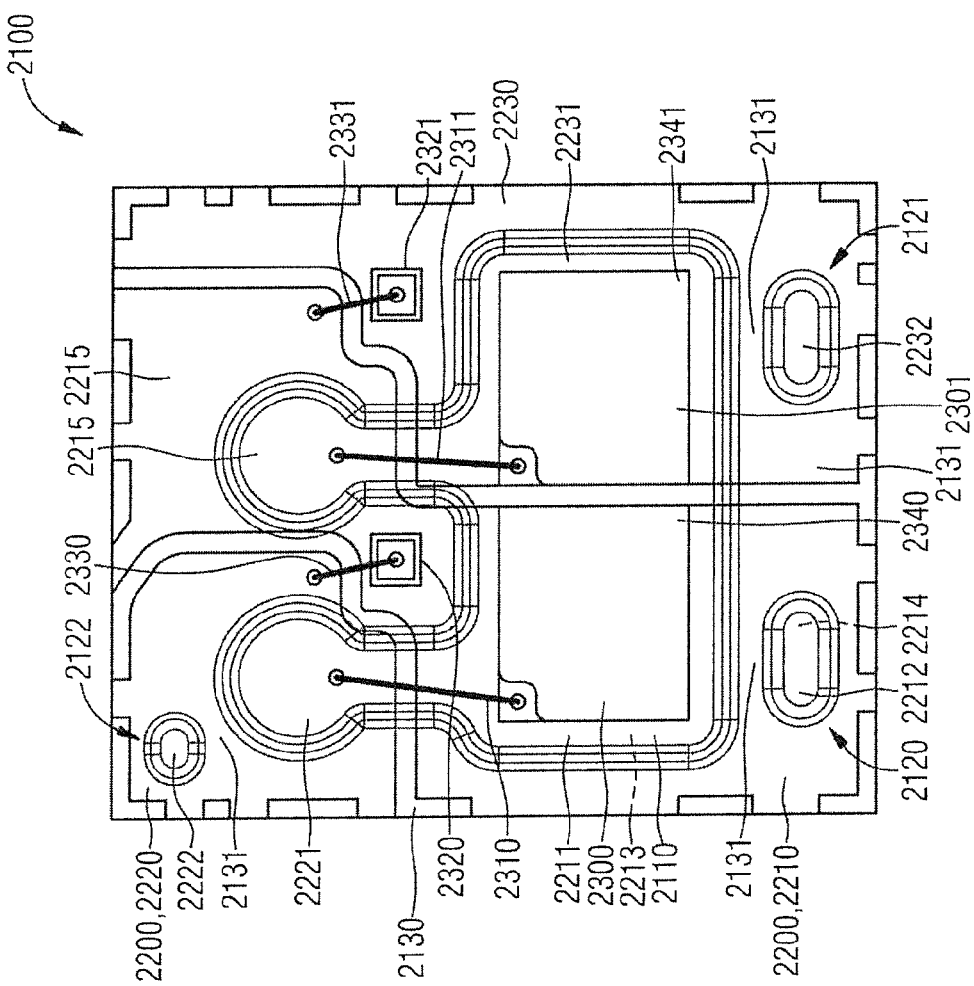
FIG. 7 shows a plan view of the part of the lead frame after embedding in a plastic material.

The lead frame 2200 may be embedded in a plastic material 2130 in a processing step chronologically following the representation of FIG. 6 to form the housing 2100 shown in the schematic plan view of FIG. 7. Embedding the lead frame 2200 may be carried out in a molding tool in a manner similar to the representation of FIG. 1 and the associated explanation.

The molding tool used to embed the lead frame 2200 in the plastic material 2130 comprises four dies, by which a first recess 2110, a second recess 2120, a third recess 2121 and a fourth recess 2122 of the housing 2100 are formed. In the first recess 2110, the first upper section 2211 of the first lead frame section 2210, the seventh upper section 2215 of the first lead frame section 2210, the third upper section 2221 of the second lead frame section 2220 and the fifth upper section 2231 of the third lead frame section 2230 are exposed and not covered by the plastic material 2130. In the second recess 2120, the second upper section 2212 of the first lead frame section 2210 is exposed and not covered by the plastic material 2130. In the third recess 2121, the sixth upper section 2232 of the third lead frame section 2230 is exposed and not covered by the plastic material 2130. In the fourth recess 2122, the fourth upper section 2222 of the second lead frame section 2220 is exposed and not covered by the plastic material 2130. The recesses 2110, 2120, 2121, 2122 of the housing 2100 are separated from one another in the lateral direction by sections 2131 of the plastic material 2130.

The first lower section 2213 and the second lower section 2214 of the first lead frame section 2210 are not covered by the plastic material 2130, but exposed and can be used as electrical contact pads. Sections of the lower side 2202 of the lead frame 2200 which lie opposite the seventh upper section 2215, the third upper section 2221, the fourth upper section 2222, the fifth upper section 2231 and the sixth upper section 2232 of the lead frame 2200 may also be exposed and used as electrical contact pads.

A first optoelectronic semiconductor chip 2300 and a second optoelectronic semiconductor chip 2301 are arranged in the first recess 2110 of the housing 2100. The first optoelectronic semiconductor chip 2300 and the second optoelectronic semiconductor chip 2301 may be configured like the optoelectronic semiconductor chip 300 of the first optoelectronic component 10. The first optoelectronic semiconductor chip 2300 is arranged on the first upper section 2211 of the first lead frame section 2210 and electrically conductively connects to the third upper section 2221 of the second lead frame section 2220 by a first bond wire 2310. The second optoelectronic semiconductor chip 2301 is arranged on the fifth upper section 2231 of the third lead frame section 2230 and electrically conductively connects to the seventh upper section 2215 of the first lead frame section 2210 by a second bond wire 2311. The first optoelectronic semiconductor chip 2300 therefore electrically connects in parallel with the first protective chip 2320 and is protected by the first protective chip 2320 against damage by electrostatic discharges. Correspondingly, the second optoelectronic semiconductor chip 2301 electrically connects in parallel with the second protective chip 2321 and is protected by the latter against damage by electrostatic discharges. The first protective chip 2320, the second protective chip 2321, the third bond wire 2330 and the fourth bond wire 2331 are embedded in the plastic material 2130 and therefore protected against damage by external effects.

A first converter element 2340 is arranged on the upper side of the first optoelectronic semiconductor chip 2300.

A second converter element 2341 is arranged on the upper side of the second optoelectronic semiconductor chip 2301. The converter elements 2340, 2341 may comprise a material with embedded wavelength-converting particles. The wavelength-converting particles may, for example, comprise an organic luminescent material or an inorganic luminescent material, or also quantum dots. The converter elements 2340, 2341 may be configured to convert a wavelength of electromagnetic radiation emitted by the optoelectronic semiconductor chips 2300, 2301. To this end, the wavelength-converting particles embedded in the converter elements 2340, 2341 may be configured to absorb electromagnetic radiation with a first wavelength and subsequently emit electromagnetic radiation with a different, typically longer, wavelength. For example, the converter elements 2340, 2341 may be configured to convert electromagnetic radiation with a wavelength in the blue spectral range into visible light.

Figure 8:
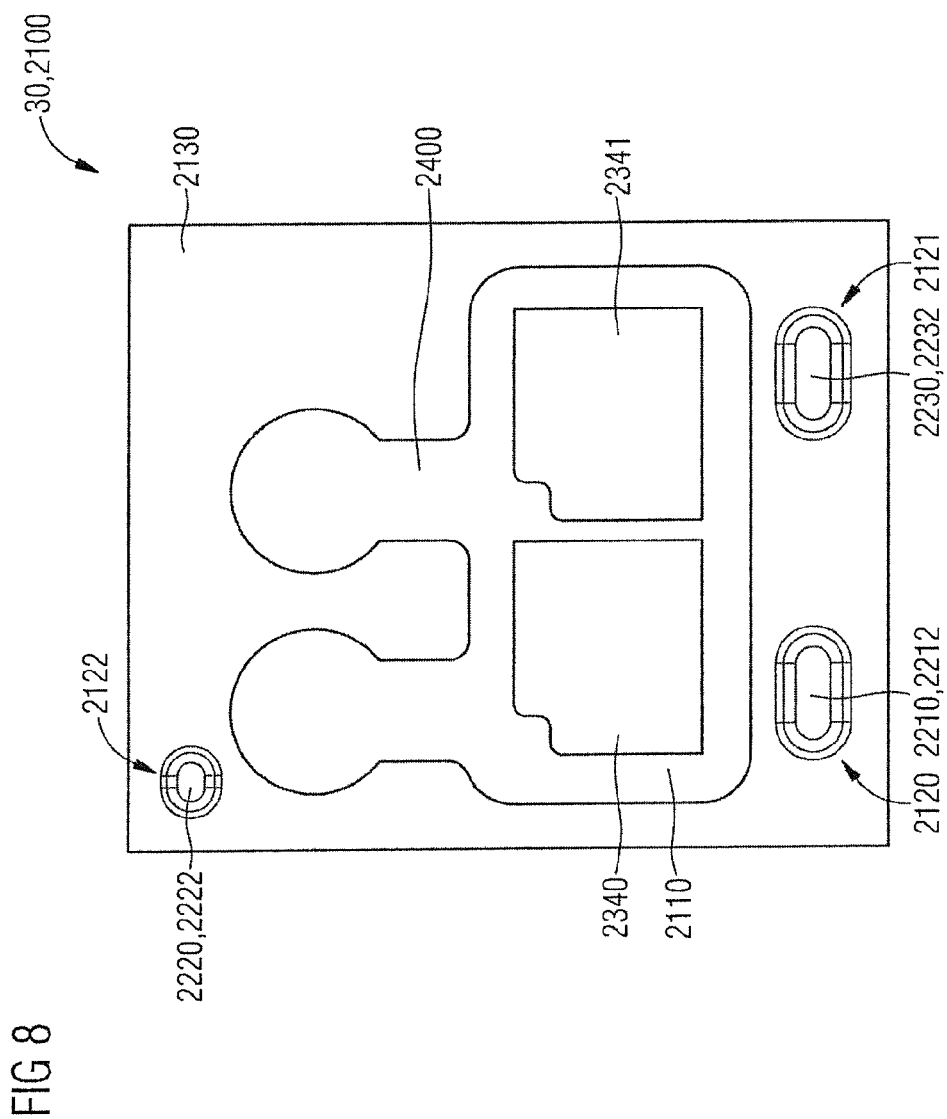
FIG. 8 shows a plan view of an optoelectronic component formed from the part of the lead frame.

FIG. 8 shows a schematic plan view of a third optoelectronic component 30 produced by further processing from the housing 2100 represented in FIG. 7. In a processing step chronologically following the representation of FIG. 7, the first recess 2110 of the housing 2100 was filled with an encapsulation material 2400. The second recess 2120, the third recess 2121 and the fourth recess 2122 have preferably remained unfilled.

The encapsulation material 2400 embeds the semiconductor chips 2300, 2301 arranged in the first recess 2110 and the converter elements 2340, 2341 arranged on the upper sides of the semiconductor chips 2300, 2301. The first bond wire 2310 and the second bond wire 2311 are also embedded in the encapsulation material 2400 and therefore protected against damage by external effects. Only the upper sides, facing away from the optoelectronic semiconductor chips 2300, 2301, of the converter elements 2340, 2341 are not covered by the encapsulation material 2400. Preferably, a surface of the encapsulation material 2400 is approximately flush with the upper sides of the converter elements 2340, 2341.

The encapsulation material 2400 may, for example, comprise silicone. The encapsulation material 2400 may comprise a filler that imparts a white appearance and high reflectivity to the encapsulation material 2400. The filler may, for example, comprise $TiO_2$.

In the second recess 2120, the third recess 2121 and the fourth recess 2122, the first lead frame section 2210, the third lead frame section 2230 and the second lead frame section 2220 are accessible. This makes it possible to electrically contact the first optoelectronic semiconductor chip 2300 and the second optoelectronic semiconductor chip 2301, without for this purpose contacting the electric contact pads of the third optoelectronic component 30 formed on the lower side 2202 of the lead frame 2200. This makes it possible to check the functional capacity of the optoelectronic semiconductor chips 2300, 2301 before final mounting of the third optoelectronic component 30. The electrical contacting of the lead frame sections 2210, 2230, 2220 accessible in the recesses 2120, 2121, 2122 may, for example, be carried out with contact tips (sampler needles) of a point probe station.

If an electrical voltage is applied between the second upper section 2212 of the first lead frame section 2210, which is accessible in the second recess 2120, and the fourth upper section 2222 of the second lead frame section 2220, which is accessible in the fourth recess 2122, then the first optoelectronic semiconductor chip 2300 of the third optoelectronic component 30 can be checked separately from the second optoelectronic semiconductor chip 2300. If an electrical voltage is applied between the sixth upper section 2232 of the third lead frame section 2230, which is accessible in the third recess 2121, and the second upper section 2212 of the first lead frame section 2210, which is accessible in the second recess 2120, then the second optoelectronic semiconductor chip 2301 of the third optoelectronic component 30 can be operated and checked independently of the first optoelectronic semiconductor chip 2300. If an electrical voltage is applied between the sixth upper section 2232 of the third lead frame section 2230, which is accessible in the third recess 2121, and the fourth upper section 2222 of the second lead frame section 2220, which is accessible in the fourth recess 2122, then the electrical series circuit of the first optoelectronic semiconductor chip 2300 and the second optoelectronic semiconductor chip 2301 can be operated together and checked. This principle may be applied similarly to components with a greater number of optoelectronic semiconductor chips.

If the first optoelectronic semiconductor chip 2300 and/or the second optoelectronic semiconductor chip 2301 are operated, then electromagnetic radiation is emitted at the upper side of the first converter element 2340 and/or of the second converter element 2341. In this case, the upper side of the first converter element 2340 and/or of the second converter element 2341 can be distinguished clearly from the surface of the encapsulation material 2400 surrounding the converter elements 2340, 2341. This may be used to arrange and align further parts, for example, an optical lens on the housing 2100 of the third optoelectronic component 30.

Our components and methods have been illustrated and described in detail with the aid of the preferred examples. This disclosure is nevertheless not restricted to the examples disclosed. Rather, other variants may be derived therefrom by those skilled in the art, without departing from the protective scope of the appended claims.

This application claims priority of DE 10 2013 219 063.8, the subject matter of which is hereby incorporated by reference.

The invention claimed is:

1. An optoelectronic component comprising a housing comprising a plastic material and a first lead frame section at least partially embedded in the plastic material, and
a first recess and a second recess,
wherein a first upper section of an upper side of the first lead frame section is not covered by the plastic material in the first recess,
a second upper section of the upper side of the first lead frame section is not covered by the plastic material in the second recess,
the first recess and the second recess are separated from one another by a section of the plastic material,
an optoelectronic semicondustor chip is arranged in the first recess, and
no optoelectronic semicondustor chip and no bond wire are arranged in the second recess.

2. The optoelectronic component as claimed in claim 1, wherein a first lower section of a lower side of the first lead frame section is not covered by the plastic material, and
the first lower section overlaps the first upper section in a projection perpendicular to the first lead frame section.

3. The optoelectronic component as claimed in claim 1, wherein a second lower section of a lower side of the first lead frame section is not covered by the plastic material, and
the second lower section overlaps the second upper section in a projection perpendicular to the first lead frame section.

4. The optoelectronic component as claimed in claim 1, further comprising a second lead frame section at least partially embedded in the plastic material,
wherein a third upper section of an upper side of the second lead frame section is not covered by the plastic material in the first recess.

5. The optoelectronic component as claimed in claim 4, wherein the third upper section electrically conductively connects to the optoelectronic semiconductor chip by a bond wire.

6. The optoelectronic component as claimed in claim 1, wherein the optoelectronic component has an optical lens or a cover, and
the optical lens or the cover is anchored on the second recess.

7. A method of producing an optoelectronic component comprising:
arranging a lead frame in a molding tool, a first part of the molding tool bearing on a first upper section of an upper side of the lead frame;
a second part, separated from the first part, of the molding tool bearing on a second upper section of the upper side of the lead frame;
embedding the lead frame in a plastic material; and
arranging an optoelectronic semiconductor chip only on the first upper section of the upper side of the lead frame, but not on the second upper section.

8. The method as claimed in claim 7, further comprising:
applying a marking in the second upper section of the lead frame.

9. The method as claimed in claim 8, wherein the marking is applied by etching, embossing, stamping or a laser.

10. The method as claimed in claim 7, further comprising checking a functional capacity of the optoelectronic component, the lead frame being electrically contacted in the second upper section during the checking.

11. The method as claimed in claim 7, further comprising dividing the plastic material and the lead frame to obtain a multiplicity of optoelectronic components.

12. The method as claimed in claim 11, wherein the plastic material and the lead frame are divided along a sawing path extending through the second upper section.

13. A method of producing an optoelectronic component comprising:
arranging a lead frame in a molding tool, a first part of the molding tool bearing on a first upper section of an upper side of the lead frame;
a second part, separated from the first part, of the molding tool bearing on a second upper section of the upper side of the lead frame;
embedding the lead frame in a plastic material; and
arranging an optoelectronic semiconductor chip only on the first upper section of the upper side of the lead frame, but not on the second upper section, wherein no bond wire is connected to the second upper section.

* * * * *